(12) United States Patent
Tabata

(10) Patent No.: US 8,072,232 B2
(45) Date of Patent: Dec. 6, 2011

(54) TEST APPARATUS THAT TESTS A DEVICE UNDER TEST HAVING A TEST FUNCTION FOR SEQUENTIALLY OUTPUTTING SIGNALS

(75) Inventor: Makoto Tabata, Saitama (JP)

(73) Assignee: Advantest Corporation, Tokyo (JP)

( * ) Notice: Subject to any disclaimer, the term of this patent is extended or adjusted under 35 U.S.C. 154(b) by 21 days.

(21) Appl. No.: 12/618,619

(22) Filed: Nov. 13, 2009

(65) Prior Publication Data

US 2010/0148815 A1 Jun. 17, 2010

Related U.S. Application Data

(63) Continuation of application No. PCT/JP2007/059877, filed on May 14, 2007.

(51) Int. Cl.
*G01R 31/26* (2006.01)
(52) U.S. Cl. .................................. 324/762.01; 324/73.1
(58) Field of Classification Search ........................... None
See application file for complete search history.

(56) References Cited

U.S. PATENT DOCUMENTS

| | | | |
|---|---|---|---|
| 5,914,964 A | 6/1999 | Saito et al. | |
| 6,301,182 B1 | 10/2001 | Tanaka | |
| 6,317,851 B1 | 11/2001 | Kobayashi | |
| 6,377,065 B1* | 4/2002 | Le et al. | 324/750.01 |
| 6,404,220 B1* | 6/2002 | Hashimoto | 324/750.01 |
| 2002/0036513 A1 | 3/2002 | Hashimoto | |

FOREIGN PATENT DOCUMENTS

| | | |
|---|---|---|
| GB | 2335280 A | 9/1999 |
| JP | 01-308978 A | 12/1989 |
| JP | 03-028596 U | 3/1991 |
| JP | 06-028892 A | 2/1994 |
| JP | 9-33615 A | 2/1997 |
| JP | 11-223660 A | 8/1999 |
| JP | 2001-043700 A | 2/2001 |
| JP | 3237579 B2 | 12/2001 |
| KR | 0363936 B1 | 12/2002 |

OTHER PUBLICATIONS

International Search Report (ISR) issued in PCT/JP2007/059877 (parent application) for Examiner consideration, citing U.S. Patent Nos. 1-2 and Foreign Patent Document Nos. 1-6 listed above.
Written Option (PCT/ISA/237) issued in PCT/JP2007/059877 (parent application).
Korean Office Action dated Apr. 26, 2011, in counterpart application KR 10-2009-7025770.

* cited by examiner

*Primary Examiner* — Minh N Tang
(74) *Attorney, Agent, or Firm* — Chen Yoshimura LLP

(57) ABSTRACT

Provided is a test apparatus that tests a device under test having a test function for sequentially outputting, from a single test terminal, signals that would be output from a plurality of terminals, the test apparatus comprising: a test section that supplies the device under test with a test signal and receives signals that are sequentially output from the test terminal in response to the test signal; an identifying section that identifies a correspondence between each signal sequentially received by the test section and a signal that would be output from one of the terminals of the device under test; and a counting section that counts a number of signals judged to be unacceptable from among the signals sequentially received by the test section for each terminal of the device under test, based on the correspondence identified by the identifying section.

5 Claims, 4 Drawing Sheets

# TEST APPARATUS THAT TESTS A DEVICE UNDER TEST HAVING A TEST FUNCTION FOR SEQUENTIALLY OUTPUTTING SIGNALS

CROSS REFERENCE TO RELATED APPLICATION

This is a continuation application of PCT/JP2007/059877 filed on May 14, 2007.

BACKGROUND

1. Technical Field

The present invention relates to a test apparatus. In particular, the present invention relates to a test apparatus that tests a device under test provided with a test function for sequentially outputting, from a single test terminal, signals that would be output from a plurality of terminals.

2. Related Art

One test for a device under test such as a semiconductor memory involves comparing a logic value output by the device under test to an expected value. For example, when testing a semiconductor memory, logic values read from the memory cells of the device under test are each compared to an expected value to judge pass/fail of each memory cell, as in, for example, Japanese Patent Application Publication No. 9-33615. At this time, the number of fails is counted for each signal terminal of the device under test to analyze how to repair the memory cells.

In order to speed up the repair analysis of the memory cells, the logic values output by the device under test can be sequentially compared to the expected value, and the number of detected fails can be sequentially counted during the testing. A test apparatus performing this process can be provided with a logic comparison circuit and a fail counter or the like for each signal terminal of the device under test.

Each logic comparison circuit may judge pass/fail by comparing the logic values read from the corresponding signal terminal to the expected value. Each fail counter may count the number of fails output by the corresponding logic comparison circuit. In this way, the number of fails for each signal terminal of the device under test can be counted, and repair analysis of the memory cells can be performed.

A known technique for decreasing the cost of the testing involves increasing the number of devices under test that are tested simultaneously. For example, by decreasing the number of pins of the test apparatus connected to a single device under test, the number of devices under test measured simultaneously can be increased without increasing the number of pins of the test apparatus.

In this case, each device under test is provided with a test function for sequentially outputting, from a single test terminal, signals that would be output from a plurality of terminals. For example, if the signal that would be output from a first signal terminal has sequential logic values of DQ1-1, DQ1-2, DQ1-3, etc. and the signal that would be output from a second signal terminal has sequential logic values of DQ2-1, DQ2-2, DQ2-3, etc., the test terminal may output a signal having sequential logic values of DQ1-1, DQ2-1, DQ1-2, DQ2-2, DQ1-3, DQ2-3, etc.

The test apparatus uses a logic comparison circuit connected to this test terminal to compare each logic value output from the test terminal to an expected value. However, the fail counter corresponding to this logic comparison circuit counts the number of fails in this logic comparison circuit, and so cannot count the number of fails separately for each signal terminal of the device under test.

In other words, the fail counter can count the total number of fails for the plurality of signal terminals corresponding to the test terminal, but cannot measure the number of fails for each individual signal terminal. Therefore, it is difficult to perform the repair analysis of the memory cells.

SUMMARY

Therefore, it is an object of an aspect of the innovations herein to provide a test apparatus, which is capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test having a test function for sequentially outputting, from a single test terminal, signals that would be output from a plurality of terminals, the test apparatus comprising: a test section that supplies the device under test with a test signal and receives signals that are sequentially output from the test terminal in response to the test signal; an identifying section that identifies a correspondence between each signal sequentially received by the test section and a signal that would be output from one of the terminals of the device under test; and a counting section that counts a number of signals judged to be unacceptable from among the signals sequentially received by the test section for each terminal of the device under test, based on the correspondence identified by the identifying section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1A:
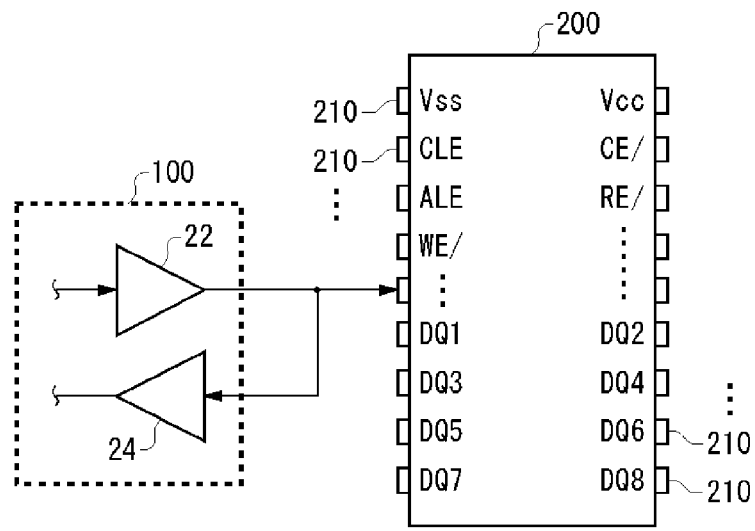
FIG. 1A shows an example of the pin configuration of the device under test 200 that is tested by the test apparatus 100 according to an embodiment of the present invention.
Figure 1B:
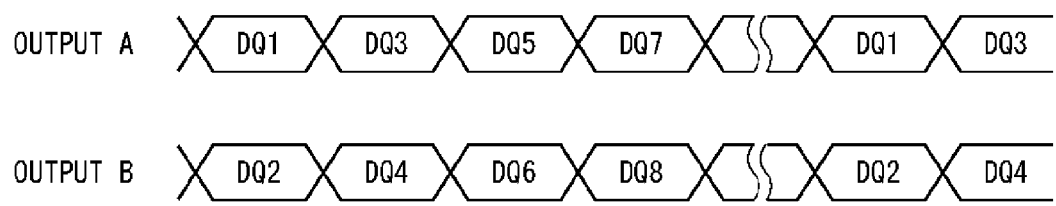
FIG. 1B shows examples of signals under measurement output from test terminals.

FIGS. 1A and 1B show an exemplary device under test 200 tested by a test apparatus 100 according to an embodiment of the present invention. FIG. 1A shows an example of the pin configuration of the device under test 200. In FIGS. 1A and 1B, a semiconductor memory is used as the device under test 200, but the device under test 200 tested by the test apparatus 100 is not limited to this. For example, the device under test 200 may be provided with an operational circuit such as a logic circuit, and the test apparatus 100 may judge acceptability of the operational circuit based on a signal under measurement output by the operational circuit when a prescribed test signal is input to the operational circuit.

As shown in FIG. 1A, the device under test 200 includes a plurality of terminals 210. For example, the device under test 200 may include, as terminals into which DUT control signals are input, terminals 210 (Vss, Vcc) into which a supply power is input, a terminal 210 (CLE) into which is input a command latch enable signal that controls whether an operation command is obtained in an internal register of the device under test 200, a terminal 210 (ALE) into which is input an address latch enable signal that controls whether address information is obtained in an internal register of the device under test 200, a terminal 210 (CE/) into which is input a chip enable signal that selects chip-units of the device under test 200, a terminal 210 (RE/) into which is input a read enable signal that allows reading from the device under test 200, a terminal 210 (WE/) into which is input a write enable signal that allows writing to the device under test 200, and the like.

The terminals into which these DUT control signals are input may be connected to a pin of the test apparatus 100 during testing as necessary to receive a test signal. The pin of the test apparatus 100 may be a pin to which a driver 22 and a comparator 24 are provided.

The device under test 200 includes terminals 210 (DQ1 to DQ8) into which are input data signals according to each bit in each address. The device under test 200 of the present embodiment stores 8-bit (DQ1 to DQ8) data at each address. In order to increase the number of simultaneous measurements, the device under test 200 of the present embodiment is provided with a test function to sequentially output, from a single test terminal, signals that would be output from the plurality of terminals 210 (DQ1 to DQ8). The test terminal may be one of the terminals 210 (DQ1 to DQ8) that inputs and outputs data, or may be a terminal 210 provided separately from the terminals 210 (DQ1 to DQ8).

A pin of the test apparatus 100 need not be connected to the terminals 210 (DQ1 to DQ8) during testing. A pin of the test apparatus 100 may be connected to the test terminal described above to receive the signal output by the test terminal. In this way, the number of pins of the test apparatus 100 that must be connected to a single device under test 200 can be decreased by decreasing the number of pins of the test apparatus 100 connected to terminals 210 that input and output data, and so more devices under test 200 can be tested simultaneously while using the same number of pins.

FIG. 1B shows exemplary signals under measurement output from test terminals. In the present embodiment, two test terminals are provided for eight terminals 210 (DQ1 to DQ8) that output data signals during actual operation. One of these test terminals outputs a signal under test A in which the signals that would be output from the terminals 210 DQ1, DQ3, DQ5, and DQ7 are arranged in order on the time axis. The other test terminal outputs a signal under test B in which the signals that would be output from the terminals 210 DQ2, DQ4, DQ6, and DQ8 are arranged in order on the time axis.

The test apparatus 100 judges whether the logic values of each of the signals that would be output from the terminals 210 (DQ1 to DQ8) match an expected value, based on the signal under measurement A and the signal under measurement B. With this process, the test apparatus 100 can test the device under test 200.

Figure 2:
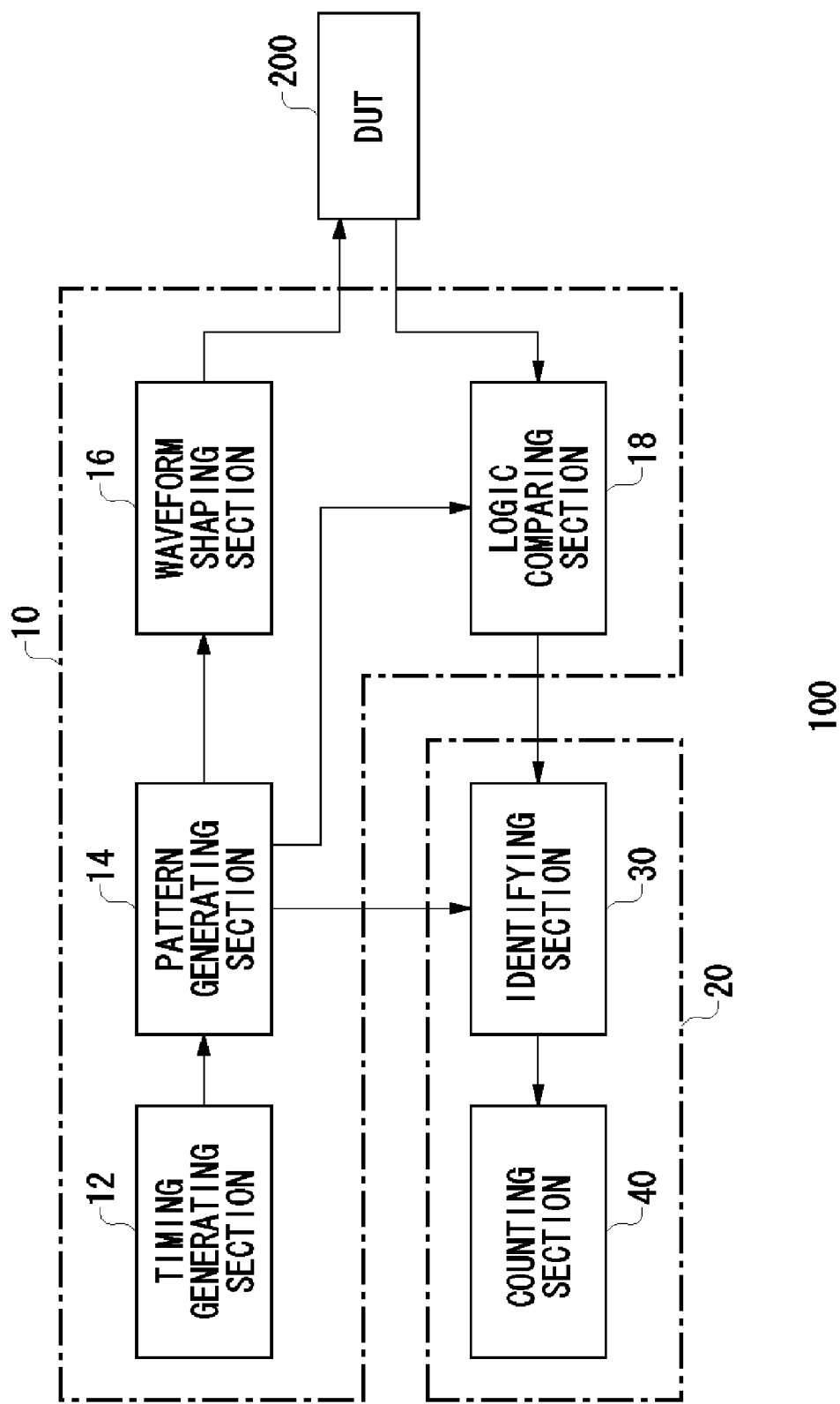
FIG. 2 shows an exemplary configuration of the test apparatus 100 according to an embodiment of the present invention.

FIG. 2 shows an exemplary configuration of the test apparatus 100 according to an embodiment of the present invention. The test apparatus 100 tests the device under test 200 provided with the test function for sequentially outputting, from a single test terminal, signals that would be output from a plurality of terminals. The test apparatus 100 is provided with a test section 10 and a fail storage section 20.

The test section 10 supplies the device under test 200 with a test signal. For example, the test section 10 generates a test signal, such as a DUT control signal for controlling the device under test 200 or a data signal to be written to the device under test 200, and supplies this test signal to the device under test 200. The test section 10 may generate a plurality of test signals and supply these test signals to the device under test 200. The test apparatus 100 may be provided with a plurality of test sections 10 that each generate one test signal. In either case, the test apparatus 100 desirably inputs a plurality of test signals simultaneously into the device under test 200.

The test section 10 may receive a signal under measurement from a test terminal of the device under test 200 in response to the test signal. The signal under measurement may be a signal in which the logic values of the signals that would be output from a plurality of terminals are arranged in order on the time axis. The test section 10 judges whether each logic value in the signal under measurement matches the expected value.

The test section 10 of the present embodiment includes a timing generating section 12, a pattern generating section 14, a waveform shaping section 16, and a logic comparing section 18. As shown in FIGS. 1A and 1B, the driver 22 may be provided between the waveform shaping section 16 and the device under test 200, and the comparator 24 may be provided between the device under test 200 and the logic comparing section 18. The timing generating section 12 generates a timing signal with a predetermined period and phase.

The pattern generating section 14 generates the logic pattern of the test signal input to the device under test 200. For example, the pattern generating section 14 may output each logic value of the test pattern in synchronization with the timing signal received from the timing generating section 12. The pattern generating section 14 may generate a logic pattern of a test signal to be written to the device under test 200, a logic pattern of a test signal designating an address of the device under test 200, and a logic pattern of each type of enable signal, and supply these logic patterns to the waveform shaping section 16. The pattern generating section 14 may also generate a logic pattern indicating a pattern of the expected values described above, and supply this logic pattern to the logic comparing section 18. The pattern generating section 14 may generate a logic pattern for controlling the fail storage section 20, and supply this logic pattern to the fail storage section 20.

The waveform shaping section 16 shapes the waveform of the test signal based on the logic pattern of the test signal generated by the pattern generating section 14, and inputs the resulting test signal to the device under test 200. For example, the waveform shaping section 16 may generate a test signal indicating a voltage corresponding to each logic value in the logic pattern.

The logic comparing section 18 receives the signal under measurement output from the test terminal of the device under test 200 in response to the test signal, and makes a comparison between the logic pattern of the signal under measurement and the expected value logic pattern received from the pattern generating section 14. The logic comparing section 18 may judge whether each logic value in the signal under measurement matches the expected value, and may output the comparison results. If signals under measurement are received from a plurality of test terminals, as described in FIG. 1B, the test apparatus 100 may use a plurality of logic comparing sections 18 to output the comparison results of the signals under measurement in parallel.

With the configuration described above, the test apparatus 100 can test the device under test 200. For example, the pattern generating section 14 and the waveform shaping section 16 may supply the device under test 200 with a test signal for writing prescribed data to a memory cell at a prescribed address in the device under test 200. The device under test 200 may then be supplied with a test signal for reading the data stored at the memory cell having this address.

The fail storage section 20 stores the comparison results of the logic comparing section 18. The fail storage section 20 of the present embodiment separates the comparison results of the logic comparing section 18 to correspond to each terminal 210 (DQ1 to DQ8) of the device under test 200, and counts the number of fails for each terminal 210. The fail storage section 20 may include an identifying section 30 and a counting section 40.

The identifying section 30 identifies a correspondence indicating which of the signals received sequentially by the test section 10 correspond to which terminal's 210 (DQ1 to DQ8) signal. In other words, the identifying section 30 identifies a correspondence between (i) each logic value of the signal under measurement received by the test section 10, where "each logic value" corresponds to the "sequentially received signals" described above, and (ii) a logic value that would be output from one of the terminals 210 (DQ1 to DQ8) of the device under test 200. The identifying section 30 may receive information for identifying this correspondence from the pattern generating section 14.

The counting section 40 counts the number of logic values judged to be unacceptable by the logic comparing section 18, i.e. the logic values that do not match the expected values, from among the logic values of the signal under measurement for each terminal 210 of the device under test 200, based on the correspondence identified by the identifying section 30. In this way, defect analysis and repair analysis can be simplified by counting the number of fails for each terminal 210 of the device under test 200.

Figure 3:
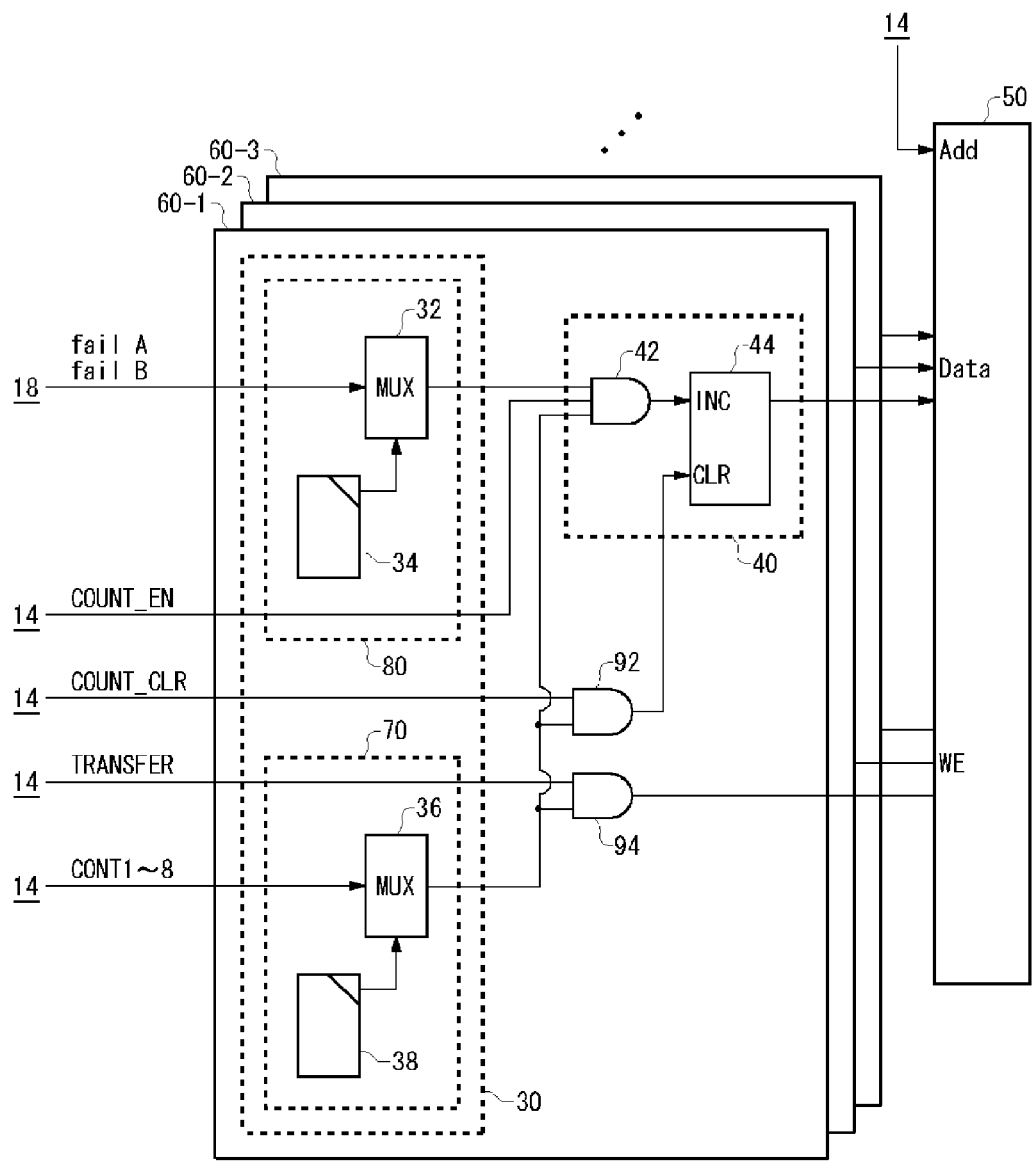
FIG. 3 shows an exemplary configuration of the fail storage section 20.

FIG. 3 shows an exemplary configuration of the fail storage section 20. The fail storage section 20 of the present embodiment includes a plurality of circuit blocks 60-1, 60-2, etc. (referred to hereinafter as "circuit blocks 60") and a fail memory 50. The circuit blocks 60 are provided to correspond one-to-one with the terminals 210 (DQ1 to DQ8) that input and output data, and each count the number of fails in the corresponding terminal 210. The identifying section 30 and the counting section 40 shown in FIG. 2 are provided to each circuit block 60.

The identifying section 30 includes a comparison result selecting section 80 and a control signal selecting section 70. The comparison result selecting section 80 selects a comparison result that includes fail information corresponding to the logic value that would be output by the corresponding terminal 210 from among a plurality of comparison results (fail_A and fail_B) output by a plurality of logic comparing sections 18, based on a correspondence between (i) the fail information of each bit in each comparison result and (ii) fail information of a logic value that would be output by one of the terminals 210 (DQ1 to DQ8) of the device under test 200.

For example, when the comparison result for the measured signal A shown in FIG. 1B is fail_A and the comparison result for the measured signal B shown in FIG. 1B is fail_B, the comparison result selecting section 80 of the circuit block 60 corresponding to one of DQ1, DQ3, DQ5, and DQ7 selects the comparison result of fail_A that includes the corresponding fail information, based on the correspondence. Furthermore, in this case, the comparison result selecting section 80 of the circuit block 60 corresponding to one of DQ2, DQ4, DQ6, and DQ8 selects the comparison result of fail_B that includes the corresponding fail information, based on the correspondence.

Each comparison result selecting section 80 in the present embodiment includes a comparison result selecting multiplexer 32 and a comparison result selecting register 34. The comparison result selecting multiplexer 32 receives in parallel the comparison results output by the plurality of logic comparing sections 18, selects the comparison result designated by the comparison result selecting register 34, and passes the selected comparison result.

The comparison result selecting register 34 stores in advance information indicating which comparison result is to be selected by the comparison result selecting multiplexer 32, based on the correspondence describe above. This information is determined according to which terminal 210 each circuit block 60 is allocated to, and may therefore be set in advance by a user or the like based on this allocation. Furthermore, by executing a test program supplied from the user or the like, the pattern generating section 14 may set information concerning the above correspondence in the comparison result selecting register 34. As another example, the pattern generating section 14 may be provided with information concerning the allocation from the user, and the pattern generating section 14 may set the information concerning the above correspondence in the comparison result selecting register 34 based on this allocation.

The control signal selecting section 70 outputs a control signal indicating which bit, in the comparison result selected by the comparison result selecting section 80, has fail information corresponding to the fail information to be counted by the circuit block 60, based on the correspondence described above. For example, the control signal selecting section 70 may generate a control signal that is logic H at a bit timing of the fail information to be counted, based on the correspondence described above.

In the present embodiment, the pattern generating section 14 may generate a plurality of control signals (CONT1 to CONT8) corresponding to the plurality of terminals 210 (DQ1 to DQ8). In other words, the pattern generating section 14 may generate a plurality of control signals to be provided to a plurality of adding sections 42, where each control signal has logic H at a different timing. The control signal selecting sections 70 in the circuit blocks 60 receive the control signals (CONT 1 to CONT8) in parallel, and each control signal selecting section 70 selects one of the control signals based on the correspondence described above and outputs the selected control signal. For example, the control signal selecting section 70 in the circuit block 60 corresponding to DQ1 may select the control signal CONT1 that has logic H at the bit timing of DQ1. With this control, the pattern generating section 14 can avoid complicated processing since each control signal need not be allocated and sent to a corresponding circuit block 60.

Furthermore, the pattern generating section 14 may supply the control signals to the circuit blocks 60 at a timing corresponding to the output timing of the test signal supplied to the device under test 200. For example, the pattern generating section 14 may supply the circuit blocks 60 with the control signals after a prescribed time has passed from when the test signal indicating reading of data from the device under test 200 is output.

Each control signal selecting section 70 in the present embodiment includes a control signal selecting multiplexer 36 and a control signal selecting register 38. The control signal selecting multiplexer 36 receives the plurality of control signals (CONT1 to CONT8) in parallel, selects the control signal designated by the control signal selecting register 38, and passes the selected signal.

The control signal selecting register 38 stores in advance information indicating which control signal is to be selected by the control signal selecting multiplexer 36, based on the correspondence described above. This information is determined according to which terminal 210 each circuit block 60 is allocated to, and may therefore be set with the same method used for the information stored in the comparison result selecting register 34.

The counting section 40 in each circuit block 60 includes a count register 44 and an adding section 42. In other words, each counting section 40 is entirely composed of a count register 44 and an adding section 42 and is provided to correspond respectively to one of the terminals 210 (DQ1 to DQ8) of the device under test 200.

The count register 44 stores the number of failures of the signal that would be output by the corresponding terminal 210. Each count register 44 in the present embodiment counts the fail information of the bit designated by the control signal output by the control signal selecting section 70 in the comparison result selected by the comparison result selecting section 80. For example, the count register 44 may count the number of times that this fail information indicates a fail, i.e. a mismatch between the logic value and the expected value.

An adding section 42 is provided to each circuit block 60 to correspond one-to-one with the count registers 44. When it is judged that the signal received by the test section 10 is a failure, the adding section 42 increases a stored value in the count register 44 corresponding to the terminal 210 that is identified by the identifying section 30 as being the terminal 210 from which this signal would be output. Each adding section 42 of the present embodiment includes an AND circuit that, when the AND of the comparison result selected by the comparison result selecting section 80 and the control signal output by the control signal selecting section 70 is logic H, increases a value stored by the count register 44 of the same circuit block 60 by a prescribed value. In this case, a fail in the comparison result is indicated by logic H, and the control signal has logic H at a bit timing of the fail information that is to be counted.

If a count enable signal COUNT_EN is provided from the pattern generating section 14 in addition to the comparison result and the control signal and the AND of these three signals is logic H, the adding section 42 may increase the stored value in the count register 44. In this case, the pattern generating section 14 generates a count enable signal that has logic H at a timing at which a fail is to be counted.

Each circuit block 60 may further include an AND circuit 92 that resets the stored value of the count register 44 to an initial value based on the AND of the control signal output by the control signal selecting section 70 and a reset signal COUNT_CLR supplied from the pattern generating section 14. Furthermore, each circuit block 60 may transfer the stored value of the count register 44 to the fail memory 50 based on the AND of the control signal output by the control signal selecting section 70 and a transfer signal TRANSFER supplied from the pattern generating section 14.

In these cases, in addition to the bit timing of the fail information to be counted, the pattern generating section 14 may generate control signals having logic H at a timing at which the stored value of the count register 44 is to be reset and a timing at which the stored value of the count register 44 is to be transferred to the fail memory 50. As described in FIG. 4 further below, the bit timing of the fail information to be counted is different from the timing of the count enable signal and the transfer signal.

Therefore, even when information is included for determining whether the transfer of the count value or resetting of the count value is to be performed at the timing of the count enable signal and the transfer signal for each circuit block 60, this information has no effect on the control for counting the fails. Even though each circuit block 60 does not receive an individual signal for controlling the reset timing and the transfer timing, the reset timing and the transfer timing of each circuit block 60 in the present embodiment can be individually controlled.

With the configuration described above, each circuit block 60 can count the number of fails of the corresponding terminal 210. The stored value of each count register 44 is transmitted to the fail memory 50 in response to a transfer signal or the like. The pattern generating section 14 may provide the fail memory 50 with an address signal indicating which address the number of fails for each bit, i.e. each terminal 210, acquired at a timing when the AND circuit 94 outputs logic H should be counted for. The test apparatus 100 can analyze which memory cells of the device under test 200 are defective and which memory cells can be repaired, based on the number of fails for each bit stored in the fail memory 50.

Figure 4:
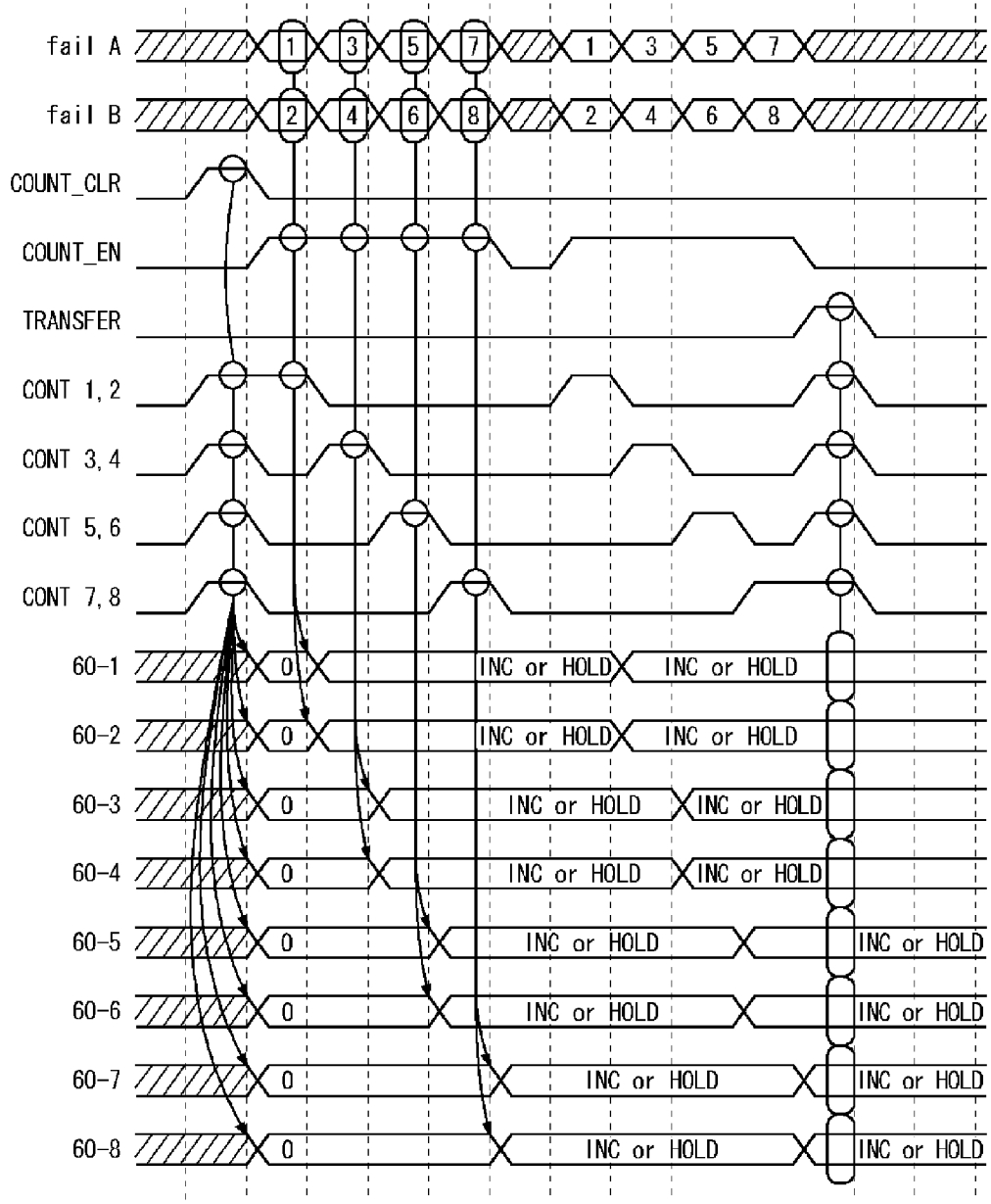
FIG. 4 is a timing chart showing an exemplary operation of the test apparatus 100.

FIG. 4 is a timing chart showing an exemplary operation of the test apparatus 100. This example describes a case where signals under measurement A and B from two test terminals are measured, as described above. As described above, the logic comparing section 18 outputs a first comparison result fail_A for the first signal under measurement A and outputs a second comparison result fail_B for the second signal under measurement B. As described above, in fail_A, pieces of fail information for the logic values that would be output by the terminals 210 DQ1, DQ3, DQ5, and DQ7 are arranged sequentially. Furthermore, in fail_B, pieces of fail information for the logic values that would be output by the terminals 210 DQ2, DQ4, DQ6, and DQ8 are arranged sequentially.

A common reset signal COUNT_CLR is input to each of the circuit blocks 60. This reset signal resets the stored value in each count register 44 to be an initial value that was held by the count register 44 before fail counting began. In the present embodiment, this initial value is 0. In the present embodiment, in order to reset the stored values in all of the count registers 44 to the initial values, all of the control signals (CONT1 to CONT8) may have logic H at the same timing as the reset signal. In this way, the output of all of the AND circuits 92 is logic H before the fail counting begins, and the stored values of the count registers 44 in all of the circuit blocks (60-1 to 60-8) are reset. As a different example, only the control signals corresponding to count registers 44 whose stored values are to be reset have logic H at the same timing that the reset signal is logic H.

Each circuit block 60 is supplied with a common count enable signal COUNT_EN. For example, the count enable signal may have logic H at a timing corresponding to each bit indicating fail information of a terminal 210 in the comparison result. By supplying such a signal to the adding sections 42, the fail counting can be permitted for each count register 44.

Each circuit block 60 is provided with the control signals (CONT1 to CONT8) in common. As shown in FIGS. 1B and 4, the pieces of fail information corresponding to terminals DQ1 and DQ2, DQ3 and DQ4, DQ5 and DQ6, and DQ7 and DQ8 each have the same bit position, and so the same signal may be used for CONT1 and CONT2, CONT3 and CONT4, CONT5 and CONT6, and CONT7 and CONT8. As shown in FIG. 4, each control signal has logic H at a bit timing of the fail information to be counted by the corresponding circuit block 60.

Each circuit block 60 generates the AND of the control signal selected by the control signal selecting section 70, from among the plurality of received control signals, and the corresponding comparison result. When this AND is logic H, indicating a fail, the adding section 42 increases (INC) the stored value of the corresponding count register 44. When this logic value is logic L, the adding section 42 holds (HOLD) the stored value of the corresponding count register 44.

The above process is repeated until the logic value of the transfer signal TRANSFER becomes logic H. Each circuit block 60 receives a common transfer signal. In the present embodiment, in order to transfer the stored values of all of the count registers 44, all of the control signals (CONT1 to CONT8) may have logic H at the same timing as the transfer signal. In this way, the output of all of the AND circuits 94 is logic H before the fail counting begins, and the stored values of the count registers 44 in all of the circuit blocks (60-1 to 60-8) are transferred to the fail memory 50. As a different example, only the control signals corresponding to count registers 44 whose stored values are to be transferred have logic H at the same timing that the transfer signal has logic H.

As described above, when measuring a device under test 200 having a test function for sequentially outputting, from a single test terminal, signals that would be output from a plurality of terminals 210, the test apparatus 100 can count the number of fails for each terminal 210. Therefore, even when the number of devices under test 200 being measured simultaneously is increased, the test apparatus 100 can easily perform defect analysis and repair analysis of the devices under test 200.

A plurality of the circuit blocks 60 shown in FIG. 3 may be provided to each driver and comparator pin shown in FIG. 1A. For example, one driver and comparator pin may be provided with a number of circuit blocks 60 corresponding to the number of bits in one address of the device under test 200. With this configuration, no matter which driver and comparator pin is connected to a test terminal, the test apparatus 100 can easily count the number of fails for each terminal 210 (DQ1 to DQ8).

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, when testing a device under test having a test function for sequentially outputting, from a single test terminal, signals that would be output from a plurality of terminals, the test apparatus according to the embodiment of the present invention can count the number of fails for each terminal. Therefore, even when the number of devices under test being measured simultaneously is increased by using this test function, the test apparatus can easily perform defect analysis and repair analysis of the devices under test.

What is claimed is:

1. A test apparatus that tests a device under test having a test function for sequentially outputting, from a single test terminal, signals that are output from a plurality of terminals of the device under test during actual operation of the device under test, the test apparatus comprising:
    a test section that supplies the device under test with a test signal and receives signals that are sequentially output from the test terminal in response to the test signal;
    an identifying section that identifies a correspondence between each signal sequentially received by the test section and one of the terminals of the device under test; and
    a counting section that counts a number of signals judged to be unacceptable from among the signals sequentially received by the test section for each terminal of the device under test, based on the correspondence identified by the identifying section, wherein the counting section includes:
        a plurality of count registers that are provided to correspond one-to-one with the plurality of terminals of the device under test, and that each store a number of unacceptable signals from among the signals identified by the identifying section as corresponding to the corresponding terminal; and
        an adding section that, when a signal received by the test section is judged to be unacceptable, increases a stored value in each of the count registers corresponding to the terminal identified by the identifying section as corresponding to the signal judged to be unacceptable.

2. The test apparatus according to claim 1, further comprising a logic comparing section that makes sequential comparisons to determine whether the signals sequentially received by the test section match an expected value, and sequentially outputs a comparison result for each signal, wherein
    the adding section includes a plurality of AND circuits that are provided to correspond one-to-one with the plurality of count registers and that each increase the stored value of the corresponding count register based on an AND of a control signal supplied thereto and the comparison results sequentially output by the logic comparing section, and
    the identifying section supplies each of the AND circuits with a control signal having logic H at a timing based on the correspondence.

3. The test apparatus according to claim 2, wherein
    the test section further generates a plurality of the control signals that each have logic H at different timings, to be supplied to the plurality of AND circuits, and
    the identifying section includes a plurality of control signal selecting sections that are provided to correspond one-to-one with the plurality of AND circuits and that each select one of the control signals based on the correspondence and supply the selected control signal to the corresponding AND circuit.

4. The test apparatus according to claim 3, wherein the control signal selecting section includes:
    a multiplexer that receives a plurality of the control signals in parallel, selects one of the control signals, and supplies the selected control signal to the corresponding AND circuit; and
    a selection control register that stores information indicating the control signal to be selected by the multiplexer based on the correspondence, and supplies the information to the multiplexer.

5. The test apparatus according to claim 3, wherein
    the test section supplies the plurality of control signals to each of the selecting sections at a timing corresponding to an output timing of the test signal.

* * * * *